(12) United States Patent
Akou et al.

(10) Patent No.: US 9,142,307 B2
(45) Date of Patent: Sep. 22, 2015

(54) NON-VOLATILE SEMICONDUCTOR MEMORY DEVICE

(71) Applicant: Kabushiki Kaisha Toshiba, Minato-ku (JP)

(72) Inventors: Masayuki Akou, Kanagawa (JP); Mitsuhiro Noguchi, Kanagawa (JP); Akimichi Goyo, Kanagawa (JP); Yu Suzuki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 222 days.

(21) Appl. No.: 13/960,153

(22) Filed: Aug. 6, 2013

(65) Prior Publication Data
US 2014/0286103 A1 Sep. 25, 2014

(30) Foreign Application Priority Data

Mar. 25, 2013 (JP) .................................. 2013-062307

(51) Int. Cl.
*G11C 16/24* (2006.01)
*G11C 16/26* (2006.01)
(Continued)

(52) U.S. Cl.
CPC *G11C 16/24* (2013.01); *G11C 7/12* (2013.01); *G11C 16/0483* (2013.01); *G11C 16/26* (2013.01); *H01L 27/11524* (2013.01)

(58) Field of Classification Search
CPC .. G11C 16/0483; G11C 11/4091; G11C 7/12; G11C 16/26; G11C 11/5642; G11C 16/24; G11C 5/025; G11C 5/04; H01L 27/11524; H01L 27/11526

USPC .......................................... 365/185.21, 51, 72
See application file for complete search history.

(56) References Cited

U.S. PATENT DOCUMENTS 7,221,028 B2 5/2007 Yu et al.
7,245,534 B2 7/2007 Goda et al.
(Continued)

FOREIGN PATENT DOCUMENTS

JP 11-273369 10/1999
JP 2005-347331 12/2005
(Continued)

OTHER PUBLICATIONS

Office Action issued Jul. 7, 2015 in Japanese Patent Application No. 2013-062307 (with English translation).

*Primary Examiner* — David Lam
(74) *Attorney, Agent, or Firm* — Oblon, McClelland, Maier & Neustadt, L.L.P.

(57) ABSTRACT

A non-volatile semiconductor memory device includes a memory cell configured to allow electrical writing and erasing, a bit line configured to transmit a potential corresponding to data stored in the memory cell in a column direction, a sense amplifier circuit configured to detect a potential of the bit line, and a bit line coupling circuit coupled between the bit line and the sense amplifier circuit. The bit line coupling circuit includes a first bit line coupling transistor in an outer layout area of the bit line coupling circuit and a second bit line coupling transistor in an inner layout area of the bit line coupling circuit. The first bit line coupling transistor has a longer distance in a channel length direction or in a channel width direction between an impurity diffused layer coupled to the bit line and an element isolation area than the second bit line coupling transistor.

20 Claims, 10 Drawing Sheets

(51) Int. Cl.
*G11C 16/04* (2006.01)
*G11C 7/12* (2006.01)
*H01L 27/115* (2006.01)

(56) References Cited

U.S. PATENT DOCUMENTS 7,259,992 B2 * 8/2007 Shirota .................... 365/185.21
7,876,610 B2 1/2011 Gomikawa et al.
2012/0241872 A1 9/2012 Endo

FOREIGN PATENT DOCUMENTS

| JP | 2007-234878 | 9/2007 |
| JP | 4851693 | 10/2011 |
| JP | 2012-204435 | 10/2012 |
| JP | 2013-30525 | 2/2013 |

* cited by examiner

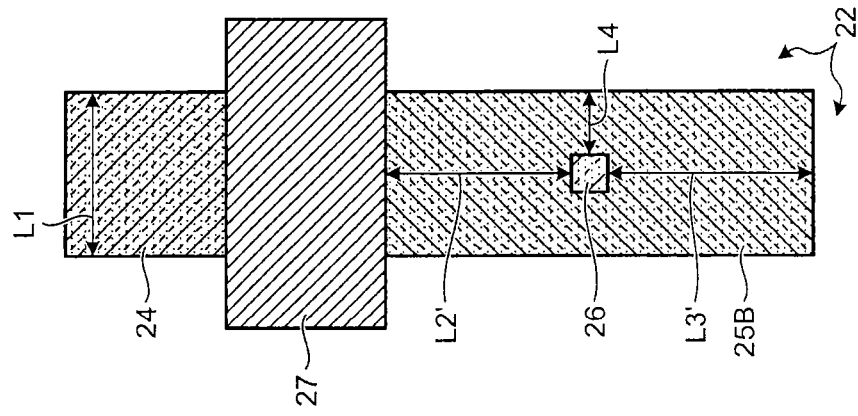
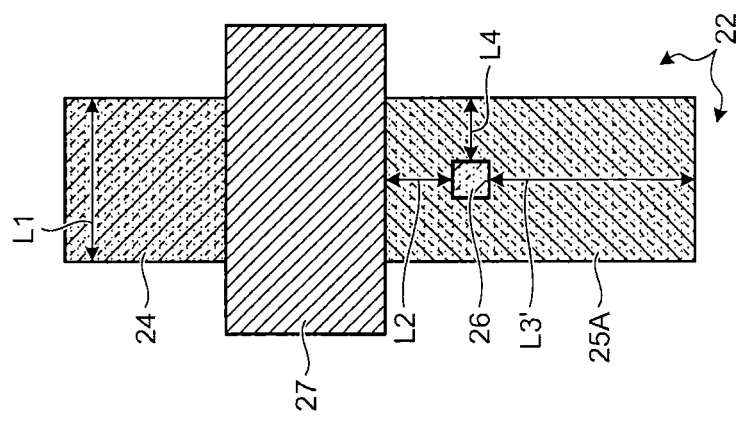
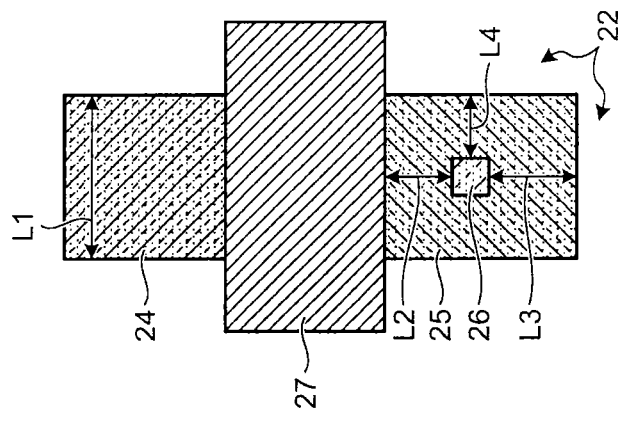

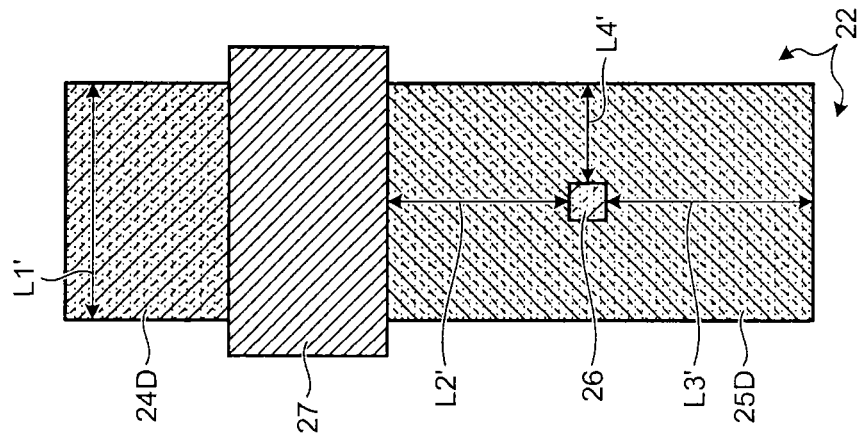
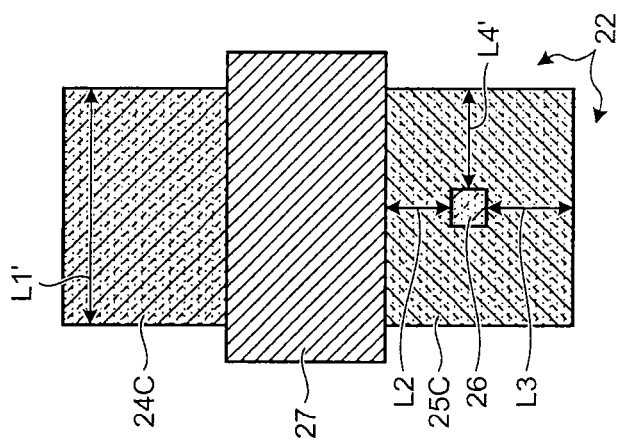
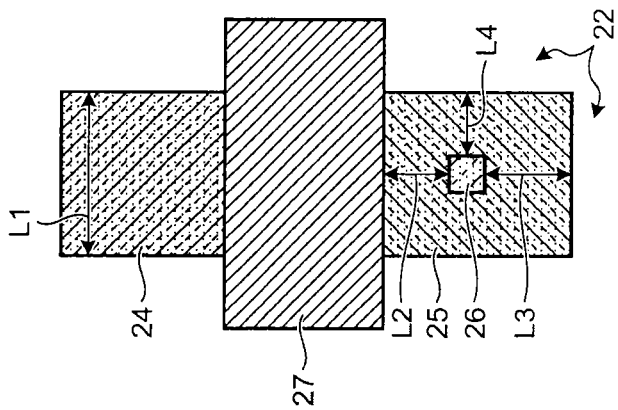

NON-VOLATILE SEMICONDUCTOR MEMORY DEVICE

CROSS-REFERENCE TO RELATED APPLICATIONS

This application is based upon and claims the benefit of priority from Japanese Patent Application No. 2013-62307, filed on Mar. 25, 2013; the entire contents of which are incorporated herein by reference.

FIELD

This embodiment generally relates to a non-volatile semiconductor memory device.

BACKGROUND

A non-volatile semiconductor memory device includes a sense amplifier circuit to sense data read from a memory cell to a bit line. Since there is demand for high-speed sense amplifier circuit, a gate insulating film of the sense amplifier circuit is getting thinner. Meanwhile, a high voltage is applied to the memory cell during writing and erasing data. In view of this, a bit line coupling transistor is disposed between the memory cell and the sense amplifier circuit such that a high voltage applied to the memory cell is not applied to the sense amplifier circuit.

BRIEF DESCRIPTION OF THE DRAWINGS

FIG. 7A is a plan view illustrating a schematic configuration of the bit line coupling transistor disposed at an inner layout area in FIG. 4 and FIG. 6;

FIG. 7B is a plan view illustrating an exemplary bit line coupling transistor disposed at an outer layout area in FIG. 4;

FIG. 7C is a plan view illustrating another exemplary bit line coupling transistor disposed at an outer layout area in FIG. 6;

FIG. 10A is a plan view illustrating the schematic configuration of the bit line coupling transistor disposed at an inner layout area in FIG. 9;

FIG. 10B is a plan view illustrating an exemplary bit line coupling transistor disposed at an outer layout area in FIG. 9;

FIG. 10C is a plan view illustrating another exemplary bit line coupling transistor disposed at the outer layout area in FIG. 9.

DETAILED DESCRIPTION

In general, according to one embodiment, a non-volatile semiconductor memory device includes a memory cell configured to allow electrical writing and erasing, a bit line configured to transmit a potential corresponding to data stored in the memory cell in a column direction, a sense amplifier circuit configured to detect a potential of the bit line, and a bit line coupling circuit coupled between the bit line and the sense amplifier circuit. The bit line coupling circuit includes a first bit line coupling transistor arranged in an outer layout area of the bit line coupling circuit and a second bit line coupling transistor arranged in an inner layout area of the bit line coupling circuit. The first bit line coupling transistor has a longer distance in a channel length direction between an impurity diffused layer coupled to the bit line and an element isolation area than the second bit line coupling transistor.

The following describes a non-volatile semiconductor memory device according to embodiments in detail with reference to the accompanying drawings. The present invention is not limited to these embodiments.

First Embodiment

Figure 1:
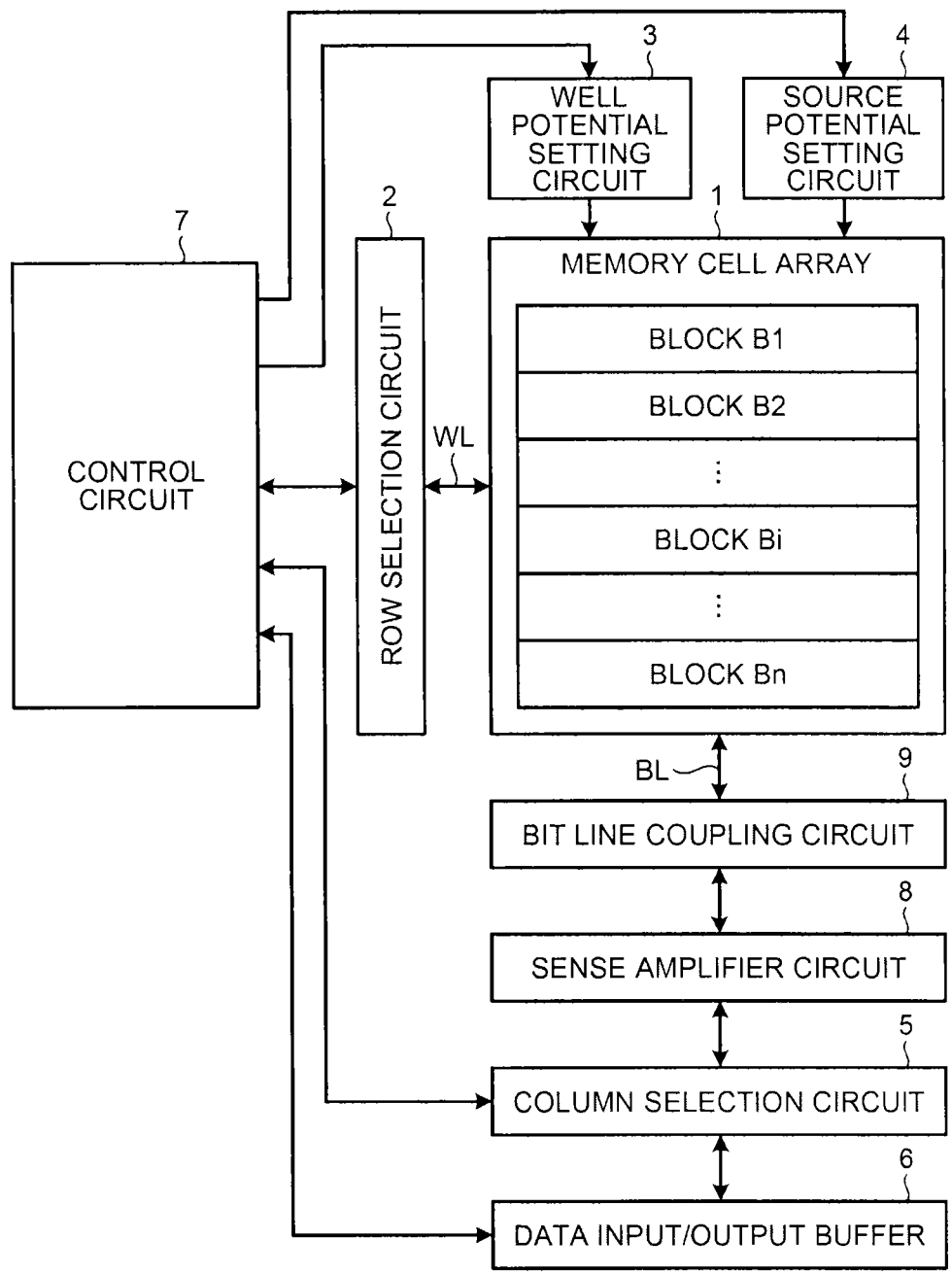
FIG. 1 is a block diagram illustrating a schematic configuration of a non-volatile semiconductor memory device according to a first embodiment.

FIG. 1 is a block diagram illustrating a schematic configuration of a non-volatile semiconductor memory device according to a first embodiment.

In FIG. 1, the semiconductor memory device includes a memory cell array 1, a row selection circuit 2, a well potential setting circuit 3, a source potential setting circuit 4, a column selection circuit 5, a data Input/output buffer 6, a control circuit 7, a sense amplifier circuit 8, and a bit line coupling circuit 9.

The memory cell array 1 has the memory cells, which store data, in a row direction and a column direction in a matrix pattern. One memory cell may be configured to store one-bit data or may be configured to store multiple data, equal to or more than two-bit data.

Here, the memory cell array 1 is divided into n blocks B1 to Bn (n is a positive integer). The respective blocks B1 to Bn can be constituted by arranging a plurality of NAND cells in the row direction. The memory cell array 1 includes a bit line BL and a word line WL. The bit line BL transmits a potential corresponding to data stored in the memory cell in a column direction. The word line WL selects the memory cell in the row direction.

The row selection circuit 2 can select a memory cell in the row direction of the memory cell array 1 during reading, writing, and erasing data of the memory cell. The well potential setting circuit 3 can set the well potential of the memory cell array 1 during reading, writing, and erasing data of the memory cell. The source potential setting circuit 4 can set the source potential of the memory cell array 1 during reading, writing, and erasing data of the memory cell. The column selection circuit 5 can select a memory cell in the column direction of the memory cell array 1 during reading, writing, and erasing data of the memory cell. The sense amplifier circuit 8 can determine data read from the memory cell per column. The data input/output buffer 6 can send a command and an address received from outside to the control circuit 7.

The data input/output buffer 6 also can transmit or receive data with the sense amplifier circuit 8 and the outside. The control circuit 7 can control operations of the row selection circuit 2, the well potential setting circuit 3, the source potential setting circuit 4, and the column selection circuit 5 based on the command and the address. The bit line coupling circuit 9 is coupled between the bit line BL and the sense amplifier circuit 8. The bit line coupling circuit 9 can cut off voltage such that a voltage equal to or more than a predetermined value applied to the bit line BL is not transmitted to the sense amplifier circuit. The voltage equal to or more than the predetermined value is a high voltage applied to the bit line BL during writing or erasing to the memory cell, for example, approximately equal to or more than 20 V. To correspond to a high-speed operation, the sense amplifier circuit 8 can use a high-speed transistor. For a high withstand voltage, the bit line coupling circuit 9 can use a high-withstand voltage transistor. The gate insulating film of the high-speed transistor can be thinner than the gate insulating film of the high-withstand voltage transistor.

Figure 2:
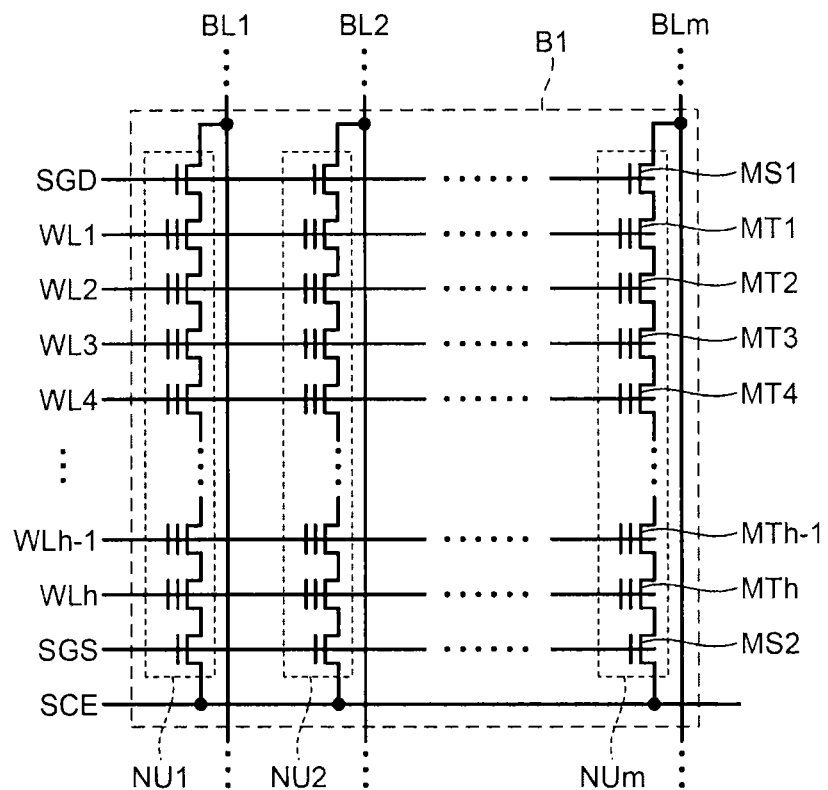
FIG. 2 is a circuit diagram illustrating the schematic configuration of the block of the non-volatile semiconductor memory device in FIG. 1.

FIG. 2 is a circuit diagram illustrating the schematic configuration of the block of the non-volatile semiconductor memory device in FIG. 1.

In FIG. 2, the blocks B1 to Bn each include h word lines WL1 to WLh (h is a positive integer), selection gate lines SGD and SGS, and a source line SCE. The blocks B1 to Bn each include common m bit lines BL1 to BLm (m is a positive integer).

The blocks B1 to Bn each include m NAND cells NU1 to NUm. The NAND cells NU1 to NUm are coupled to the respective bit lines BL1 to BLm.

Here, the NAND cells NU1 to NUm each include cell transistors MT1 to MTh and selection transistors MS1 and MS2. One memory cell in the memory cell array 1 can be constituted of one cell transistor. A NAND string is constituted by the serially coupled cell transistors MT1 to MTh. Each of the NAND cells NU1 to NUm is constituted by coupling the selection transistors MS1 and MS2 to both ends of the NAND string.

In each of the NAND cells NU1 to Num, control gate electrodes of the cell transistors MT1 to MTh are coupled to the respective word lines WL1 to WLh. A page is constituted of a plurality of memory cells that shares each of the word lines WL1 to WLh in the row direction. In each of the NAND cells NU1 to NUm, one end of the NAND string, which includes the cell transistors MT1 to MTh, is coupled to each of the bit lines BL1 to BLm via the selection transistor MS1. The other end of the NAND string is coupled to the source line SCE via the selection transistor MS2. The selection gate line SGD is coupled to the gate electrode of the selection transistor MS1 while the selection gate line SGS is coupled to the gate electrode of the selection transistor MS2.

Figure 3:
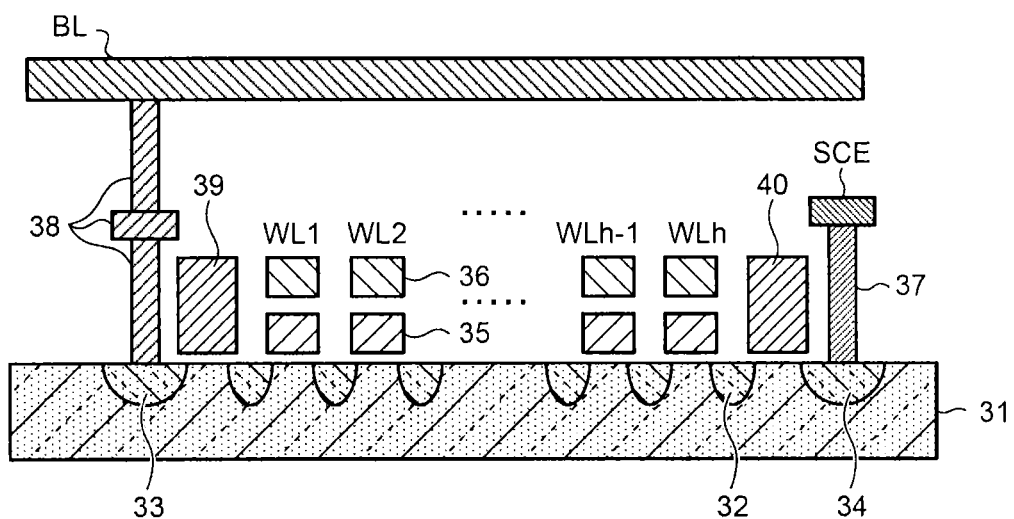
FIG. 3 is a cross-sectional view illustrating a schematic configuration of one NAND cell of the non-volatile semiconductor memory device in FIG. 1.

FIG. 3 is a cross-sectional view illustrating a schematic configuration of one NAND cell of the non-volatile semiconductor memory device in FIG. 1;

In FIG. 3, a charge accumulation layer 35 and selection gate electrodes 39 and 40 are disposed on a well 31 via the gate insulating film. In FIG. 3, a control gate electrode 36 is disposed on the charge accumulation layer 35 via an interelectrode insulating film. In a planar NAND flash memory, a floating gate can be used as the charge accumulation layer 35. The film thickness of the gate insulating film can be set to approximately 1 to 10 nm.

The well 31 includes an impurity diffused layer 32 and impurity diffused layers 33 and 34. The impurity diffused layer 32 is disposed between the charge accumulation layers 35 or between the charge accumulation layer 35 and the selection gate electrodes 39 and 40. The impurity diffused layers 33 and 34 are disposed between the selection gate electrodes 39 and 40 at neighboring NAND cells. For example, the well 31 can be formed by a P type, and the impurity diffused layers 32, 33, and 34 can be formed by an N type.

The impurity diffused layer 33 is coupled to the bit line BL via a coupling conductor 38 while the impurity diffused layer 34 is coupled to the source line SCE via a coupling conductor 37. The control gate electrodes 36 of the respective memory cells are coupled to the word lines WL1 to WLh. The selection gate electrodes 39 and 40 are coupled to the respective selection gate lines SGD and SGS.

In a writing operation, a writing voltage Vpp (for example, 20 V) is applied to a selected word line and 0 V is applied to a selected bit line. In a writing operation, a voltage sufficient to turn on a non-selected cell of the NAND string including a selected cell is applied to a non-selected word line, and a write protect voltage Vfe (for example, 3 V) is applied to a non-selected bit line. A voltage that turns on the selection transistor MS1 is applied to the selection gate line SGD, and a voltage that turns off the selection transistor MS2 is applied to the selection gate line SGS.

Then, the 0 V voltage applied to the selected bit line is transferred to the selected cell via the selection transistor MS1 and the non-selected cell. The well 31 and the impurity diffused layer 32 are set to 0 V. At this time, since the writing voltage Vpp is applied to the selected word line, a high voltage is applied to the control gate electrode 36 of the selected cell, the potential of the charge accumulation layer 35 of the selected cell increases. In view of this, when a charge is injected from a channel of the selected cell to the charge accumulation layer 35 through tunneling, thresholds of the cell transistors MT1 to MTh of the selected cell increases, and then the writing operation of the selected cell is performed.

Meanwhile, in the NAND cell coupled to the non-selected bit line, since the write protect voltage Vfe is applied to the non-selected bit line, the selection transistor MS1 turns off. As a result, the cell transistors MT1 to MTh of the NAND cell coupled to the non-selected bit line enter a floating state. The potential of the channel of the non-selected cell coupled to the selected word line increases so as to follow the writing voltage Vpp applied to the selected word line (self-boost). Accordingly, in the non-selected cell, a charge is not injected from the channel to the charge accumulation layer 35, and threshold voltages of the cell transistors MT1 to MTh of the non-selected cell are prevented from increasing.

Meanwhile, in an erasing operation, 0 to 1 V is applied to the word lines WL1 to WLh of the respective blocks B1 to Bn, and the well potential of the memory cell array 1 is set to an erase voltage Ve (for example, 20 V). At this time, a high voltage is applied between the well 31 and the control gate electrode 36 of the memory cell of each of blocks B1 to Bn, and a charge accumulated to the charge accumulation layer 35 is extracted. As a result, a threshold of the cell transistors MT1 to MTh of the respective blocks B1 to Bn is lowered, and the erasing operation of the memory cell is executed.

In a reading operation, a reading voltage Vrg is applied to the selected word line while an intermediate voltage sufficient to turn on the cell transistor is applied to the non-selected word line (for example, 5 to 13 V). An intermediate voltage sufficient to turn on the selection transistors MS1 and MS2 is applied to the selection gate lines SGD and SGS. A precharge voltage is applied to the selected bit line, and 0 to 1.5 V is applied to the source line SCE.

In the case where the threshold of the selected cell does not reach a reading level, a charge charged to the selected bit line is discharged via the NAND string. Accordingly, the potential of the selected bit line becomes a low level. On the other hand, in the case where the threshold of the selected cell reaches the reading level, a charge charged to the selected bit line is not discharged via the NAND string. Accordingly, the potential of the selected bit line becomes high level.

By detection of whether the potential of the selected bit line is a low level or a high level by the sense amplifier circuit 8, whether the threshold of the selected cell reaches the reading level or not is determined, and data stored in the selected cell is read.

Figure 4:
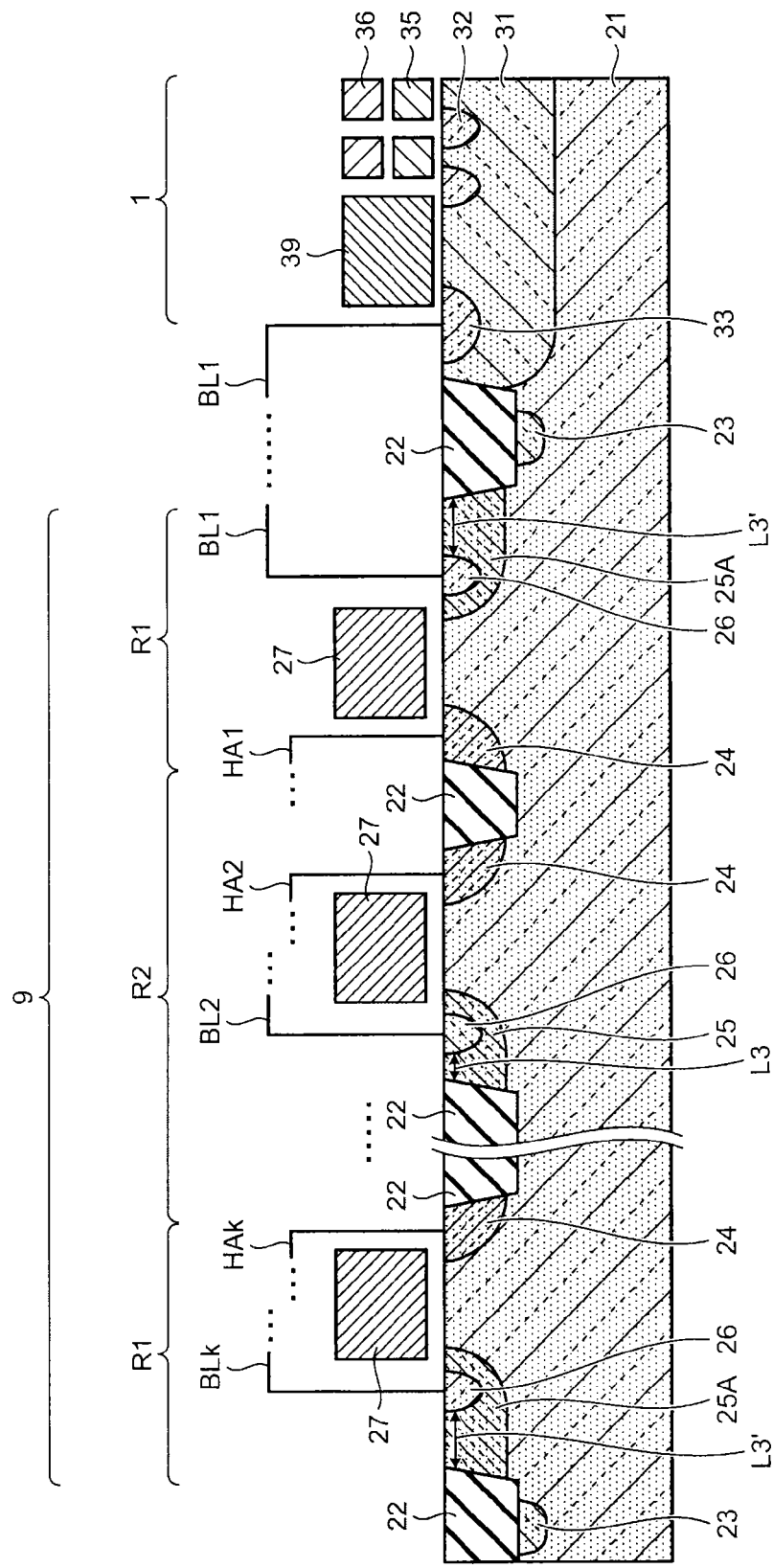
FIG. 4 is a cross-sectional view illustrating the schematic configuration of the bit line coupling circuit in FIG. 1.

FIG. 4 is a cross-sectional view illustrating the schematic configuration of the bit line coupling circuit in FIG. 1.

In FIG. 4, the bit line coupling circuit 9 includes an outer layout area R1 and an inner layout area R2 in a layout area. The outer layout area R1 can be disposed at the outermost periphery of the layout area of the bit line coupling circuit 9 so as to surround the inner layout area R2. In the outer layout area R1 and the inner layout area R2, a bit line coupling transistor is formed for each of bit lines BL1 to BLk (k: integer equal to or more than 3). The bit line coupling transistor can be disposed in a matrix pattern such that a channel length direction matches the column direction.

Here, an element isolation area 22 is formed on a semiconductor substrate 21. The element isolation area 22 elementary isolates the bit line coupling transistor. The element isolation area 22, for example, can employ an STI (Shallow Trench Isolation) structure. The element isolation area 22 can be made of a silicon dioxide film.

In the outer layout areas R1 and the inner layout area R2, gate electrodes 27 are formed above active areas elementary isolated by the element isolation area 22 via the gate insulating films. The film thickness of the gate insulating film can be set to approximately 13 to 40 nm. The active areas in the inner layout area R2 include a high-concentration impurity diffused layer 24 and a low-concentration impurity diffused layer 25 at both sides of the channel area under the gate electrode 27. The active areas in the outer layout area R1 include the high-concentration impurity diffused layer 24 and a low-concentration impurity diffused layer 25A at both sides of the channel area under the gate electrode 27. The low-concentration impurity diffused layers 25 and 25A internally include a high-concentration impurity diffused layer 26. The high-concentration impurity diffused layer 24 can be used as a source layer, and the high-concentration impurity diffused layer 26 can be used as a drain layer. The low-concentration impurity diffused layers 25 and 25A can be used as an LDD layer. The semiconductor substrate 21 can be set to a P type while the low-concentration impurity diffused layers 25 and 25A and the high-concentration impurity diffused layers 24 and 26 can be set to an N type. The surface concentration of the high-concentration impurity diffused layers 24 and 26 can be set within a range of $10^{19}$ cm$^{-3}$ to $10^{22}$ cm$^{-3}$. The surface concentration of the low-concentration impurity diffused layers 25 and 25A can be set within a range of $10^{17}$ cm$^{-3}$ to $10^{19}$ cm$^{-3}$. The bonding depth of the low-concentration impurity diffused layers 25 and 25A and the high-concentration impurity diffused layers 24 and 26 can be set within a range of, for example, 10 to 300 nm. A distance between the outer peripheral portion of the high-concentration impurity diffused layer 26 and the outer periphery portions of the low-concentration impurity diffused layers 25 and 25A can be set within a range of 0.05 to 2 μm. The semiconductor substrate 21 includes an impurity diffused layer, which will become a punch-through stopper layer 23. The punch-through stopper layer 23 is formed under the element isolation area 22 to surround the outside of the outer layout area R1. The punch-through stopper layer 23 is an opposite conductive type to the source layer/drain layer of the bit line coupling transistor and can be set to a P type of higher concentration than the semiconductor substrate 21.

The high-concentration impurity diffused layers 26 of the respective bit line coupling transistors are coupled to the bit lines BL1 to BLk. The high-concentration impurity diffused layers 24 of the respective bit line coupling transistors are coupled to the sense amplifier circuit 8 via respective wirings HA1 to HAk. The sense amplifier circuit 8 can be constituted with a P type transistor and an N type transistor. The film thicknesses of the gate insulating films of the P type transistor and the N type transistor can be set approximately 1 to 10 nm.

The bit lines BL1 to BLk are coupled to the impurity diffused layer 33 in the well 31, where a memory cell is formed. In view of this, applying the erase voltage Ve to the well 31 during an erasing operation increases the potentials of the bit lines BL1 to BLk to the erase voltage Ve at maximum, through coupling.

Meanwhile, the sense amplifier circuit 8 includes a thin gate insulating film to increase speed. The sense amplifier circuit 8 is constituted with a low-withstand voltage transistor that operates at a voltage of approximately 1.5 to 3.3 V. During an erasing operation, a voltage of approximately 1.5 to 3.3 V is applied to the gate electrode 27 of the bit line coupling transistor. A high voltage, approximately 20 V, applied to the bit lines BL1 to BLk is cut off by the bit line coupling transistor. In view of this, transmission of a high voltage, approximately 20 V, applied to the bit lines BL1 to BLk during the erasing operation to the sense amplifier circuit 8 can be prevented, thus protecting the sense amplifier circuit 8. During the erasing operation, a voltage of approximately 1.5 to 3.3 V may be applied to the gate electrode 27 of the bit line coupling transistor and the high-concentration impurity diffused layer 24. Accordingly, the source layer of the bit line coupling transistor can be set to a positive potential relative to the semiconductor substrate 21. This can reduce a leak current by a back-bias effect compared with the case where a voltage of 0 V is applied to the high-concentration impurity diffused layer 24 of the bit line coupling transistor.

Here, the high-concentration impurity diffused layer 26 of the bit line coupling transistor disposed in the outer layout area R1 is close to the punch-through stopper layer 23. Hence, an increase in a leak current relative to an increase of the drain voltage (bit line voltage) of the bit line coupling transistor disposed at the outer layout area R1 becomes significant compared with the bit line coupling transistor disposed at the inner layout area R2. If the leak current increases, pressure rising of the well 31 to a desired erase voltage Ve during the erasing operation fails. There is a concern that a failure occurs in erasing.

In view of this, a distance L3', which is a distance between the high-concentration impurity diffused layer 26 of the bit line coupling transistor disposed in the outer layout area R1 and the element isolation area 22 in the channel length direction, is set longer than a distance L3, which is a distance between the high-concentration impurity diffused layer 26 of the bit line coupling transistor disposed in the inner layout area R2 and the element isolation area 22 in the channel length direction. This reduces a leak current of the bit line coupling transistor disposed in the outer layout area R1 while achieving miniaturizing the bit line coupling transistor in the inner layout area R2.

Figure 5:
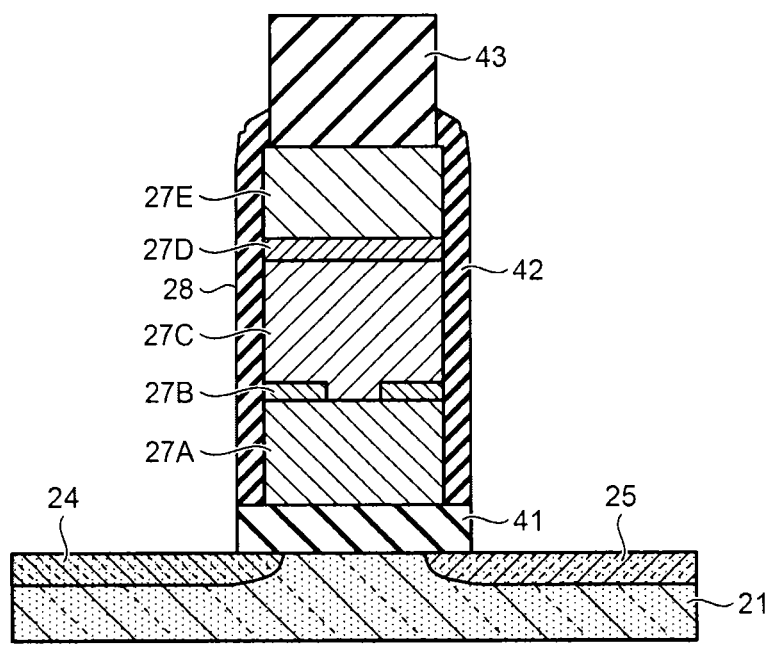
FIG. 5 is a cross-sectional view illustrating an exemplary configuration of a bit line coupling transistor in FIG. 4.

FIG. 5 is a cross-sectional view illustrating an exemplary configuration of a bit line coupling transistor in FIG. 4. A high-withstand voltage transistor used as the bit line coupling transistor refers to a transistor where a voltage of equal to or more than 15 V is applied.

In FIG. 5, the semiconductor substrate 21 is provided with a lower gate electrode 27A via a gate insulating film 41. For example, boron can be doped on the semiconductor substrate 21 as P type impurities. A P type impurity concentration from the surface of the semiconductor substrate 21 to a depth up to 1 μm can be set equal to or more than $10^{14}$ cm$^{-3}$ and equal to or less than $5 \times 10^{16}$ cm$^{-3}$. The gate insulating film 41 can be formed using, for example, a silicon dioxide film or a silicon oxynitride film as a material with a film thickness of 13 nm to 40 nm. By using the gate insulating film 41 with the film thickness of equal to or more than 13 nm, even if a high voltage equal to or more than 20 V is applied between the lower gate electrode 27A and the semiconductor substrate 21, generation of a leak through tunneling is reduced, thus reducing deterioration in reliability of a MOS transistor. The lower gate electrode 27A can be formed simultaneously and with the same material as the charge accumulation layer 35 of a memory cell transistor. For example, a conductive polysilicon where phosphorus, arsenic, or boron is added with concentration of $10^{18}$ cm$^{-3}$ to $10^{21}$ cm$^{-3}$ can be used as the material. The film thickness of the lower gate electrode 27A, for example, can be set within a range of 30 nm to 120 nm.

An upper gate electrode 27C is formed above the lower gate electrode 27A via an inter-electrode insulating film 27B. The lower gate electrode 27A and the upper gate electrode 27C are coupled through an opening formed at the inter-electrode insulating film 27B. As the inter-electrode insulating film 27B, for example, a silicon dioxide film/a silicon nitride film/a silicon dioxide film, a silicon nitride film/a silicon dioxide film/a silicon nitride film/a silicon dioxide film/a silicon nitride film, a silicon dioxide film/AlOx/a silicon dioxide film, a silicon dioxide film/HfAlOx/a silicon dioxide film, a silicon dioxide film/HfOx/a silicon dioxide film, or a silicon dioxide film of the entire thickness of 2 nm to 30 nm can be employed. The upper gate electrode 27C can be a three-layer construction where, for example, a polysilicon film of thickness within a range of 10 nm to 100 nm, tungsten nitride (WN) of thickness within a range of 2 nm to 40 nm, and tungsten (W) of thickness within a range of 10 nm to 100 nm are sequentially laminated. The upper gate electrode 27C can be formed simultaneously with the control gate electrode 36 of the memory cell transistor.

A cap layer 27D, a mask layer 27E, and an interlayer insulating film 43 are sequentially formed above the upper gate electrode 27C. The lower gate electrode 27A, the inter-electrode insulating film 27B, the upper gate electrode 27C, the cap layer 27D, and the mask layer 27E have a sidewall 42 on a sidewall. The high-concentration impurity diffused layer 24 and the low-concentration impurity diffused layer 25 are formed on both sides of the channel area under the lower gate electrode 27A on the semiconductor substrate 21. The cap layer 27D can use a silicon dioxide film or a silicon nitride film. The mask layer 27E, the sidewall 42, and the interlayer insulating film 43 can use a silicon dioxide film.

Figure 6:
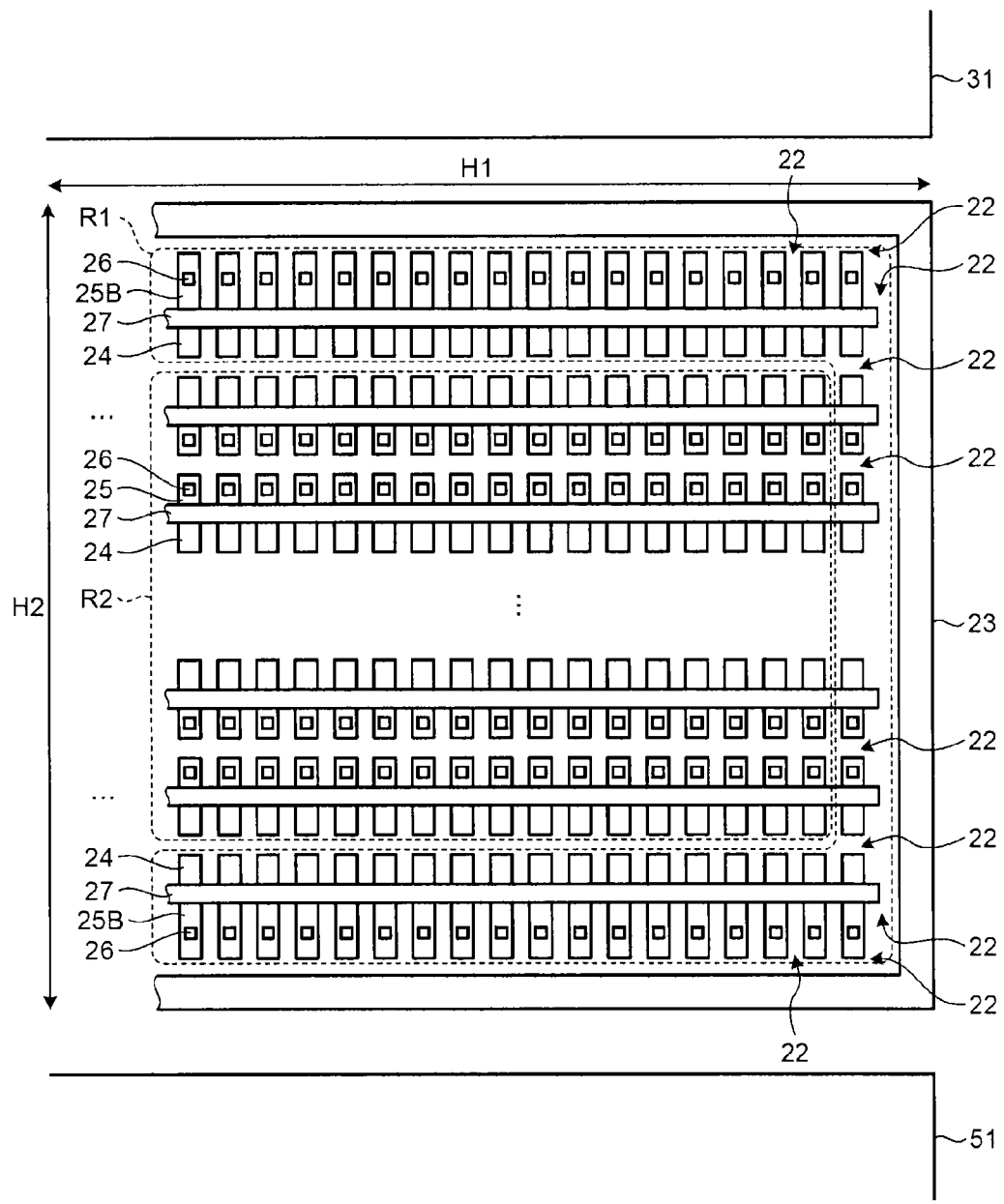
FIG. 6 is a plan view illustrating an exemplary layout of the bit line coupling transistor disposed at the bit line coupling circuit in FIG. 1.

FIG. 6 is a plan view illustrating an exemplary layout of the bit line coupling transistor disposed at the bit line coupling circuit in FIG. 1.

In FIG. 6, wells 31 and 51 are formed on the semiconductor substrate 21, and the layout area of the bit line coupling circuit 9 is disposed between the wells 31 and 51. The wells 31 and 51 can be formed as a P type. The memory cell array 1 can be formed at the well 31, and the sense amplifier circuit 8 can be formed at the well 51.

The layout area of the bit line coupling circuit 9 includes the outer layout area R1 and the inner layout area R2. The outer layout area R1 and the inner layout area R2 include the bit line coupling transistors in a matrix pattern. The bit line coupling transistors are elementary isolated by the element isolation area 22. The punch-through stopper layer 23 is formed outside of the outer layout area R1.

The outer layout area R1 and the inner layout area R2 include the gate electrodes 27 on the active area via the gate insulating film. The high-concentration impurity diffused layer 24 and the low-concentration impurity diffused layer 25 are formed on both sides of the channel area under the gate electrode 27 in the active area of the inner layout area R2. The high-concentration impurity diffused layer 24 and a low-concentration impurity diffused layer 25B are formed on both sides of the channel area under the gate electrode 27 in the active area of the outer layout area R1. The low-concentration impurity diffused layers 25 and 25B internally include the high-concentration impurity diffused layers 26. The low-concentration impurity diffused layers 25 and 25B can be used as an LDD layer. A distance between elements of the bit line coupling transistors can be set to approximately 0.3 to 1 μm.

In the bit line coupling transistors disposed in the matrix pattern, the bit line coupling transistors neighboring in the channel length direction include the high-concentration impurity diffused layers 24 or the low-concentration impurity diffused layers 25 facing one another. In the outer layout area R1, the bit line coupling transistors close to the wells 31 and 51 are formed such that the high-concentration impurity diffused layers 24 of neighboring bit line coupling transistors in the inner layout area R2 face one another, and the low-concentration impurity diffused layers 25B are disposed at the outermost periphery. The high-concentration impurity diffused layers 26 of the respective bit line coupling transistors are coupled to the bit lines BL1 to BLm. The high-concentration impurity diffused layers 24 of the respective bit line coupling transistors are coupled to the sense amplifier circuit 8.

A distance between the high-concentration impurity diffused layers 26 at the outermost periphery of the bit line coupling transistors disposed close to the wells 31 and 51 in the outer layout area R1 and the element isolation area 22 in the channel length direction is set longer than a distance between the high-concentration impurity diffused layer 26 of the bit line coupling transistor disposed in the inner layout area R2 and the element isolation area 22 in the channel length direction. Furthermore, a distance between the high-concentration impurity diffused layers 26 and the gate electrodes 27 of the bit line coupling transistors disposed close to the wells 31 and 51 in the outer layout area R1 in the channel length direction is set longer than a distance between the high-concentration impurity diffused layer 26 and the gate electrode 27 of the bit line coupling transistor disposed in the inner layout area R2 in the channel length direction.

This allows reducing a leak current and improving a withstand voltage of the bit line coupling transistors disposed along a channel width direction in the outer layout area R1 at the sides close to the wells 31 and 51. It is not required to assigning a layout area for the bit line coupling transistor in the inner layout area R2 beyond necessity. This allows reducing an increase in an array length H2 of the bit line coupling circuit 9.

FIG. 7A is a plan view illustrating a schematic configuration of the bit line coupling transistor disposed at the inner layout area in FIG. 4 and FIG. 6. FIG. 7B is a plan view illustrating an exemplary bit line coupling transistor disposed at the outer layout area in FIG. 4. FIG. 7C is a plan view illustrating another exemplary bit line coupling transistor disposed at the outer layout area in FIG. 6.

In FIG. 7A, regarding the bit line coupling transistor disposed in the inner layout area R2 in FIG. 4 and FIG. 6, a distance between the high-concentration impurity diffused layer 26 of the bit line coupling transistor and the element isolation area 22 in the channel length direction is set to L3. A distance between the high-concentration impurity diffused layer 26 of the bit line coupling transistor and the element isolation area 22 in the channel width direction is set to L4. A distance between the high-concentration impurity diffused layer 26 and the gate electrode 27 of the bit line coupling transistor in the channel length direction is set to L2. The channel width of the bit line coupling transistor is set to L1. A channel width L1 can be set to approximately 0.4 to 1.2 μm.

In FIG. 7B, the distance L3', which is the distance between the high-concentration impurity diffused layer 26 of the bit line coupling transistor disposed in the outer layout area R1 and the element isolation area 22 in the channel length direction in FIG. 4, is longer than the distance L3, which is the distance between the high-concentration impurity diffused layer 26 of the bit line coupling transistor disposed in the inner layout area R2 and the element isolation area 22 in the channel length direction in FIG. 4. It is preferred that the distance L3' be approximately 0.35 to 0.6 μm and be enlarged at least within the range of equal to or more than 0.1 μm to equal to or less than 0.3 μm, compared with the distance L3.

In FIG. 7C, the distance L3', which is the distance between the high-concentration impurity diffused layer 26 of the bit line coupling transistor disposed in the outer layout area R1 and the element isolation area 22 in the channel length direction in FIG. 6, is longer than the distance L3, which is the distance between the high-concentration impurity diffused layer 26 of the bit line coupling transistor disposed in the inner layout area R2 and the element isolation area 22 in the channel length direction in FIG. 6. Furthermore, a distance L2', which is a distance between the high-concentration impurity diffused layer 26 and the gate electrode 27 of the bit line coupling transistor disposed in the outer layout area R1 in the channel length direction, is longer than a distance L2, which is the distance between the high-concentration impurity diffused layer 26 and the gate electrode 27 of the bit line coupling transistor disposed in the inner layout area R2 in the channel length direction.

Figure 8:
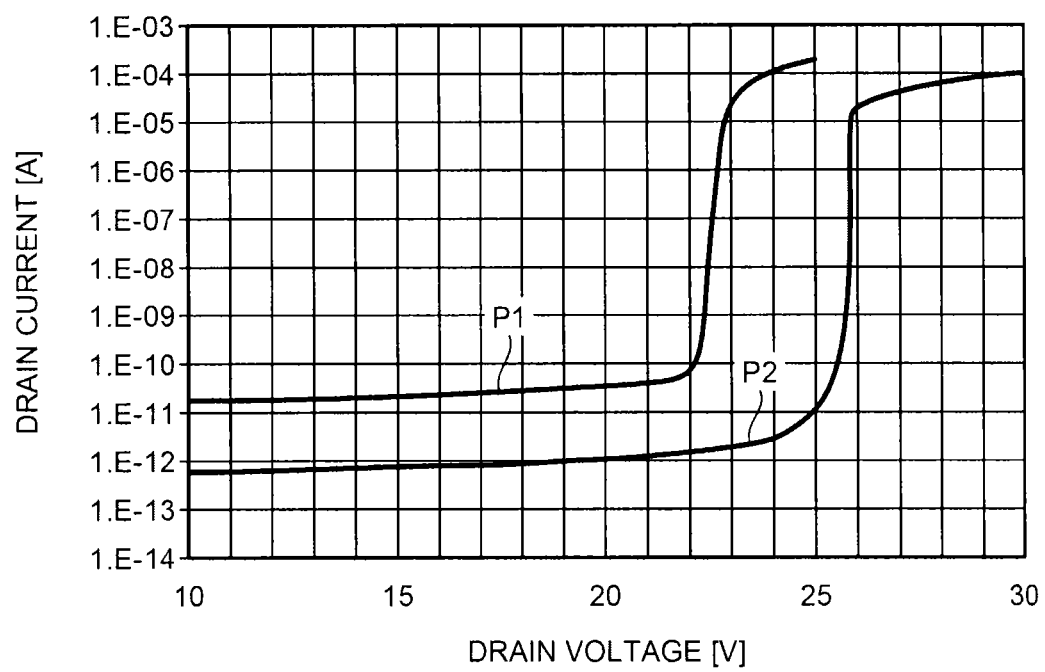
FIG. 8 is a diagram illustrating a relationship between a drain current and a drain voltage of the bit line coupling transistor in FIG. 6.

FIG. 8 is a diagram illustrating a relationship between a drain current and a drain voltage of the bit line coupling transistor in FIG. 6. P2 shows a case where equal to or more than 5 bit line coupling transistors are disposed in an array pattern horizontally and vertically, the drain voltage of the bit line coupling transistor near the array center is changed, and the drain voltages of the other transistors are maintained at 15 V. P1 shows a case where drain voltages of all bit line coupling transistors disposed in an array pattern are changed at a time.

In FIG. 8, the rising of the drain currents within a range of 1E-10 [A] to 1E-6 [A] shows the surface withstand voltage of drain layers of the respective bit line coupling transistors. Obviously, it can be seen that P2 has a higher withstand voltage of equal to or more than 3 V than the withstand voltage of P1. This indicates that, compared with the bit line coupling transistor at the center portion, the bit line coupling transistor at the peripheral portion has a factor that degrades the withstand voltage by equal to or more than 3 V.

Like the bit line coupling transistor, if a channel width is approximately 0.4 to 1.2 mm, a high electric field is applied to the corner at lower end of the element isolation area 22 in the depletion layer of the drain layer when an erase voltage is applied. This may lead to a leakage failure and breakdown of withstand voltage. Especially, since the bit line coupling transistor positioned at the outermost periphery in the layout area of the bit line coupling circuit 9 is close to a boundary with the punch-through stopper layer 23, a withstand voltage failure and a leak failure at the end of the element isolation are concerned.

Compared with the bit line coupling transistor in the array, the bit line coupling transistor at the array end is close to the punch-through stopper layer 23. Accordingly, the impurity distribution indicates concentrated boron at the lower end of the element isolation area 22. Applying an erase voltage extends the depletion layer of the drain layer of the bit line coupling transistor. At this time, if the punch-through stopper layer 23 is present, an impurity concentration gradient at the corner at the lower end of the element isolation area 22 becomes large. Accordingly, the extension of the depletion layer in the drain layer is restricted, and a high electric field is applied easily. Especially, with an arrangement of the bit line coupling transistors like FIG. 6, the bit line coupling transistor at the end has a closer distance to the punch-through stopper layer 23. Therefore, the depletion layer in the drain layer is less likely to extend, degrading a withstand voltage limited at the depletion layer.

In the experiment of FIG. 8, a distance between the bit line coupling transistor and the punch-through stopper layer 23 was secured equal to or more than one and a half times with respect to a distance of element isolations between the bit line coupling transistors to maintain a distance so as not to cause the withstand voltage to degrade in an evaluation of a single transistor. However, when the bit line coupling transistors were disposed in an array pattern, a withstand voltage was affected.

To improve the withstand voltage of the bit line coupling transistors, reducing electric fields at the surface layer of the drain layer and at the lower end of the element isolation area 22 is important. Simply increasing the distances L2 to L4 in FIG. 7A reduces these electric fields. Here, considering a cause that degrades the withstand voltage of equal to or more than 3 V of the bit line coupling transistor at the peripheral portion compared with the withstand voltage of the bit line coupling transistor at the center portion exists, the bit line coupling transistors like FIG. 7B or FIG. 7C are disposed only at the peripheral portion. This reduces an increase in chip area and also improves reliability of the bit line coupling circuit 9.

Second Embodiment

Figure 9:
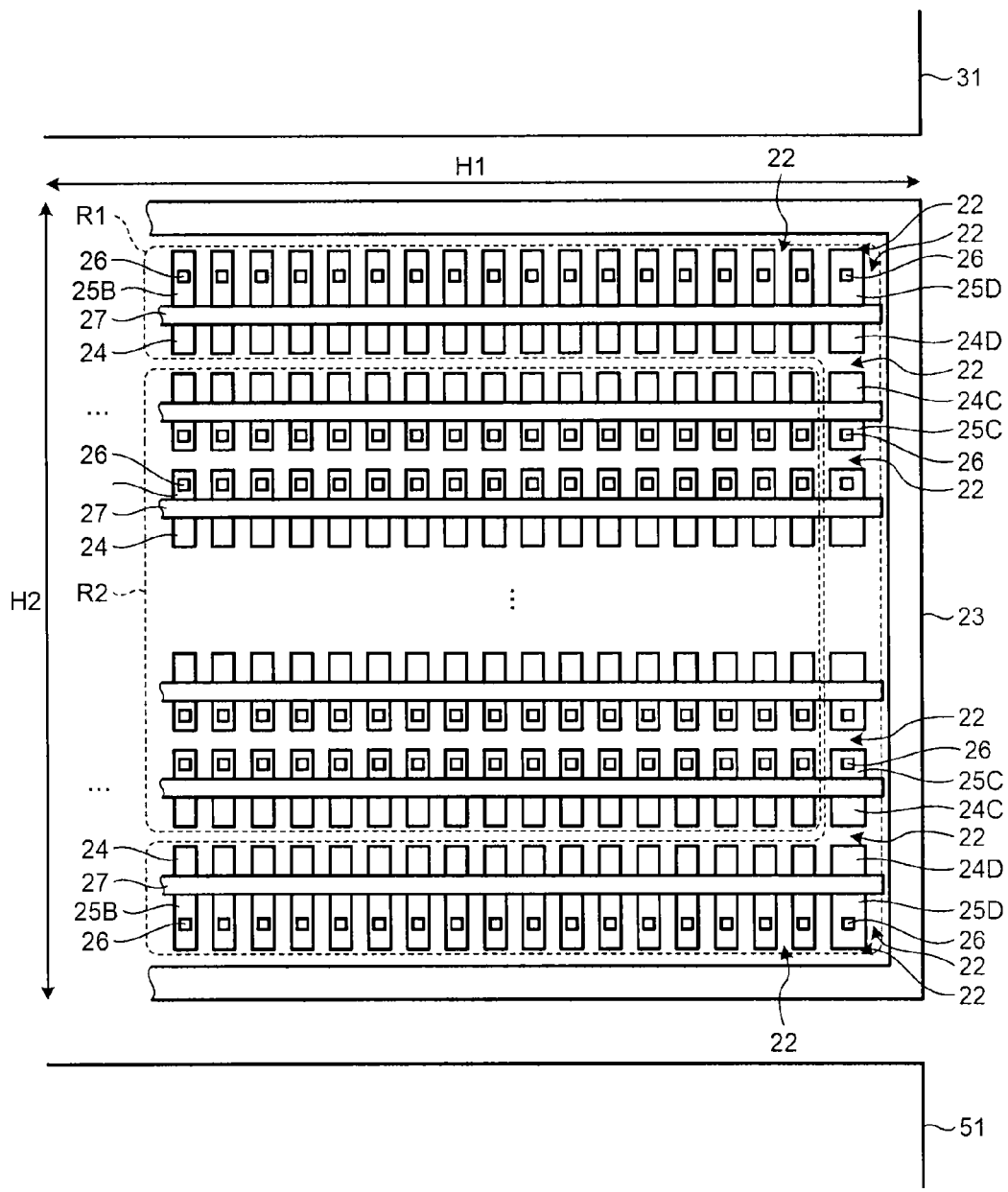
FIG. 9 is a plan view illustrating an exemplary layout of the bit line coupling transistor applied to a non-volatile semiconductor memory device according to a second embodiment.

FIG. 9 is a plan view illustrating an exemplary layout of the bit line coupling transistor applied to a non-volatile semiconductor memory device according to a second embodiment.

In FIG. 9, similarly to the layout in FIG. 6, the low-concentration impurity diffused layers 25B are disposed at the bit line coupling transistors disposed along the channel width direction in the outer layout area R1 at the sides close to the wells 31 and 51 instead of the low-concentration impurity diffused layers 25 in the inner layout area R2.

Meanwhile, high-concentration impurity diffused layers 24C and low-concentration impurity diffused layers 25C are disposed at the bit line coupling transistors disposed along the channel length direction in the outer layout area R1 instead of the high-concentration impurity diffused layer 24 and the low-concentration impurity diffused layer 25 in the inner layout area R2. High-concentration impurity diffused layers 24D and low-concentration impurity diffused layers 25D are disposed at four corners of the outer layout area R1 instead of the high-concentration impurity diffused layer 24 and the low-concentration impurity diffused layer 25 in the inner layout area R2.

Here, a distance between the high-concentration impurity diffused layers 26 of the bit line coupling transistor disposed along the channel length direction in the outer layout area R1 and the element isolation area 22 in the channel width direction is set longer than a distance between the high-concentration impurity diffused layer 26 of the bit line coupling transistor disposed in the inner layout area R2 and the element isolation area 22 in the channel width direction.

This allows reducing a leak current and improving a withstand voltage of the bit line coupling transistors disposed in the outer layout area R1. It is not required to assign a layout area for the bit line coupling transistor in the inner layout area R2 beyond necessity. This allows reducing an increase in an array width H1 and the array length H2 of the bit line coupling circuit 9.

FIG. 10A is a plan view illustrating the schematic configuration of the bit line coupling transistor disposed at the inner layout area in FIG. 9. FIG. 10B is a plan view illustrating an exemplary bit line coupling transistor disposed at the outer layout area in FIG. 9. FIG. 10C is a plan view illustrating another exemplary bit line coupling transistor disposed at the outer layout area in FIG. 9.

In FIG. 10A, regarding the bit line coupling transistor disposed in the inner layout area R2 in FIG. 9, a distance between the high-concentration impurity diffused layer 26 of the bit line coupling transistor and the element isolation area 22 in the channel length direction is set to L3. A distance between the high-concentration impurity diffused layer 26 of the bit line coupling transistor and the element isolation area 22 in the channel width direction is set to L4. A distance between the high-concentration impurity diffused layer 26 and the gate electrode 27 of the bit line coupling transistor in the channel length direction is set to L2.

In FIG. 10B, a distance L4', which is a distance between the high-concentration impurity diffused layers 26 of the bit line coupling transistor disposed along the channel length direction in the outer layout area R1 and the element isolation areas 22 in the channel width direction of FIG. 9, is longer than a distance L4, which is a distance between the high-concentration impurity diffused layer 26 of the bit line coupling transistor disposed in the inner layout area R2 and the element isolation area 22 in the channel width direction. A channel width L1' of the bit line coupling transistor disposed along the channel length direction in the outer layout area R1 is longer than the channel width L1 of the bit line coupling transistor disposed in the inner layout area R2.

In FIG. 10C, the distance L3', which is a distance between the high-concentration impurity diffused layers 26 of the bit line coupling transistor disposed at four corners of the outer layout area R1 and the element isolation areas 22 in the channel length direction, is longer than the distance L3, which is the distance between the high-concentration impurity diffused layer 26 of the bit line coupling transistor disposed in the inner layout area R2 and the element isolation area 22 in the channel length direction. The distance L4', which is a distance between the high-concentration impurity diffused layers 26 of the bit line coupling transistor disposed at four corners of the outer layout area R1 and the element isolation areas 22 in the channel width direction, is longer than the distance L4, which is a distance between the high-concentration impurity diffused layer 26 of the bit line coupling transistor disposed in the inner layout area R2 and the element isolation area 22 in the channel width direction. Furthermore, the distance L2', which is a distance between the high-concentration impurity diffused layers 26 and the gate electrodes 27 of the bit line coupling transistor disposed at the four corners of the outer layout area R1 in the channel length direction, is longer than the distance L2, which is the distance between the high-concentration impurity diffused layer 26 and the gate electrode 27 of the bit line coupling transistor disposed in the inner layout area R2 in the channel length direction.

In FIG. 10C, a distance between the high-concentration impurity diffused layer 26 and the gate electrode 27 in the channel length direction may be equal to the distance L2 in the bit line coupling transistor disposed in the inner layout area R2, similarly to the bit line coupling transistor disposed in the outer layout area R1 of FIG. 4. In FIG. 10B and FIG. 10C, the distance between the high-concentration impurity diffused layer 26 of each bit line coupling transistor and the element isolation area 22 in the channel width direction is set longer than the distance of both sides of the high-concentration impurity diffused layer 26 of the bit line coupling transistor disposed in the inner layout area R2. However, the distance between the high-concentration impurity diffused layer 26 and the element isolation area 22 in the channel width direction may be lengthened only at the side close to the punch-through stopper layer 23. The distance between the high-concentration impurity diffused layer 26 and the element isolation area 22 in the channel width direction at the side close to the inner layout area R2 may be equal to the distance L4, which is the distance of the bit line coupling transistor disposed in the inner layout area R2.

Third Embodiment

Figure 11:
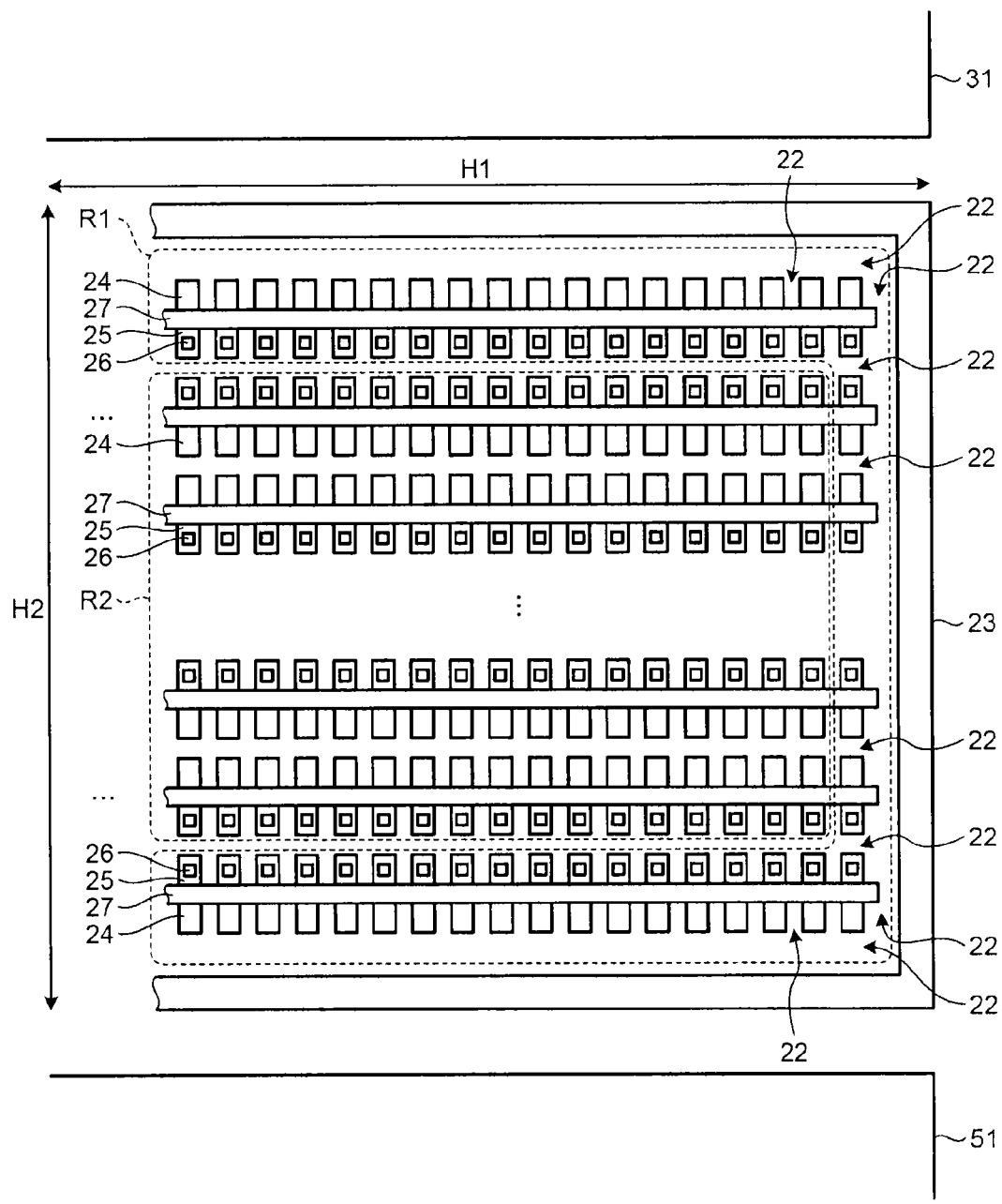
FIG. 11 is a plan view illustrating an exemplary layout of the bit line coupling transistor applied to a non-volatile semiconductor memory device according to a third embodiment.

FIG. 11 is a plan view illustrating an exemplary layout of the bit line coupling transistor applied to a non-volatile semiconductor memory device according to a third embodiment.

In the layout of FIG. 11, the bit line coupling transistor disposed in the outer layout area R1 has the same size as the size of the bit line coupling transistor disposed in the inner layout area R2.

However, by switching the arrangement of the high-concentration impurity diffused layer 24 and the low-concentration impurity diffused layer 25 in the layout area of the bit line coupling circuit 9, in the bit line coupling transistors disposed in the outer layout area R1 to the side close to the wells 31 and 51, the high-concentration impurity diffused layers 26 coupled to the bit lines BL1 to BLm are disposed inside of the high-concentration impurity diffused layers 24 coupled to the sense amplifier circuit 8.

This allows providing a larger distance between the high-concentration impurity diffused layers 26 of the bit line coupling transistors disposed in the outer layout area R1 to the side close to the wells 31 and 51 and the punch-through stopper layer 23, compared with the case where the high-concentration impurity diffused layers 26 are disposed outside. In view of this, the leak current of the bit line coupling transistor can be reduced without increasing the size of the bit line coupling transistor disposed in the outer layout area R1. This allows reducing increases in the array width H1 and the array length H2 of the bit line coupling circuit 9. Similarly to the second embodiment, the distance along the channel width direction between the high-concentration impurity diffused layer 26 and the element isolation area 22 of the bit line coupling transistor disposed along the channel length direction in the outer layout area R1 may be longer than the distance of the bit line coupling transistor disposed in the inner layout area R2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
   a memory cell configured to allow electrical writing and erasing;
   a bit line configured to transmit a potential corresponding to data stored in the memory cell in a column direction;
   a sense amplifier circuit configured to detect a potential of the bit line; and
   a bit line coupling circuit coupled between the bit line and the sense amplifier circuit, wherein
   the bit line coupling circuit includes:
       a first bit line coupling transistor arranged in an outer layout area of the bit line coupling circuit; and
       a second bit line coupling transistor arranged in an inner layout area of the bit line coupling circuit, wherein
   the first bit line coupling transistor has a longer distance in a channel length direction between an impurity diffused layer coupled to the bit line and an element isolation area than the second bit line coupling transistor.

2. The non-volatile semiconductor memory device according to claim 1, further comprising:
   a first well where a memory cell array including the memory cell is formed; and
   a second well where the sense amplifier circuit is formed, wherein
   a layout area of the bit line coupling circuit is disposed between the first well and the second well.

3. The non-volatile semiconductor memory device according to claim 1, wherein
   a layout area of the bit line coupling circuit is surrounded by a punch-through stopper layer.

4. The non-volatile semiconductor memory device according to claim 1, wherein
   the bit line coupling circuit includes a high-withstand voltage transistor, and
   the sense amplifier circuit includes a low-withstand voltage transistor.

5. The non-volatile semiconductor memory device according to claim 1, wherein
   the first bit line coupling transistor has a longer distance between the impurity diffused layer coupled to the bit line and a gate electrode than the second bit line coupling transistor.

6. The non-volatile semiconductor memory device according to claim 1, wherein
   the outer layout area is disposed at an outermost periphery of a layout area of the bit line coupling circuit, the outer layout area surrounding the inner layout area.

7. The non-volatile semiconductor memory device according to claim 1, wherein
   each of the first and second bit line coupling transistors includes an LDD layer disposed between the element isolation area and a gate electrode, the LDD layer surrounding the impurity diffused layer coupled to the bit line, and
   the first bit line coupling transistor includes the longer LDD layer than the second bit line coupling transistor in a channel length direction.

8. A non-volatile semiconductor memory device, comprising:
   a memory cell configured to allow electrical writing and erasing;
   a bit line configured to transmit a potential corresponding to data stored in the memory cell in a column direction;
   a sense amplifier circuit configured to detect a potential of the bit line; and
   a bit line coupling circuit coupled between the bit line and the sense amplifier circuit, wherein
   the bit line coupling circuit includes:
       a first bit line coupling transistor arranged in an outer layout area of the bit line coupling circuit; and
       a second bit line coupling transistor arranged in an inner layout area of the bit line coupling circuit, wherein
   the first bit line coupling transistor has a longer distance in a channel width direction between an impurity diffused layer coupled to the bit line and an element isolation area than the second bit line coupling transistor.

9. The non-volatile semiconductor memory device according to claim 8, further comprising:
   a first well where a memory cell array including the memory cell is formed; and
   a second well where the sense amplifier circuit is formed, wherein
   a layout area of the bit line coupling circuit is disposed between the first well and the second well.

10. The non-volatile semiconductor memory device according to claim 8, wherein
    a layout area of the bit line coupling circuit is surrounded by a punch-through stopper layer.

11. The non-volatile semiconductor memory device according to claim 8, wherein
    the bit line coupling circuit includes a high-withstand voltage transistor, and
    the sense amplifier circuit includes a low-withstand voltage transistor.

12. The non-volatile semiconductor memory device according to claim 8, wherein
    the first bit line coupling transistor has a longer distance between the impurity diffused layer coupled to the bit line and a gate electrode than the second bit line coupling transistor.

13. The non-volatile semiconductor memory device according to claim 8, wherein
    the first bit line coupling transistor has a longer distance in a channel length direction between the impurity diffused layer coupled to the bit line and the element isolation area than the second bit line coupling transistor.

14. The non-volatile semiconductor memory device according to claim 8, wherein
    the outer layout area is disposed at an outermost periphery of a layout area of the bit line coupling circuit, the outer layout area surrounding the inner layout area.

15. The non-volatile semiconductor memory device according to claim 8, wherein
    each of the first and second bit line coupling transistors includes an LDD layer disposed between the element isolation area and a gate electrode, the LDD layer surrounding the impurity diffused layer coupled to the bit line, and
    the first bit line coupling transistor includes the longer LDD layer than the second bit line coupling transistor in a channel width direction.

16. A non-volatile semiconductor memory device, comprising:
  a memory cell configured to allow electrical writing and erasing;
  a bit line configured to transmit a potential corresponding to data stored in the memory cell in a column direction;
  a sense amplifier circuit configured to detect a potential of the bit line; and
  a bit line coupling circuit coupled between the bit line and the sense amplifier circuit, wherein
  the bit line coupling circuit includes:
    a first bit line coupling transistor arranged in an outer layout area of the bit line coupling circuit; and
    a second bit line coupling transistor arranged in an inner layout area of the bit line coupling circuit, wherein
  the first bit line coupling transistor includes an impurity diffused layer coupled to the bit line disposed inside of an impurity diffused layer coupled to the sense amplifier circuit.

17. The non-volatile semiconductor memory device according to claim 16, further comprising:
  a first well where a memory cell array including the memory cell is formed; and
  a second well where the sense amplifier circuit is formed, wherein
  a layout area of the bit line coupling circuit is disposed between the first well and the second well.

18. The non-volatile semiconductor memory device according to claim 16, wherein
  a layout area of the bit line coupling circuit is surrounded by a punch-through stopper layer.

19. The non-volatile semiconductor memory device according to claim 16, wherein
  the bit line coupling circuit includes a high-withstand voltage transistor, and
  the sense amplifier circuit includes a low-withstand voltage transistor.

20. The non-volatile semiconductor memory device according to claim 16, wherein
  the outer layout area is disposed at an outermost periphery of a layout area of the bit line coupling circuit, the outer layout area surrounding the inner layout area.

* * * * *